United States Patent
Mogi et al.

[11] Patent Number: 6,026,885
[45] Date of Patent: Feb. 22, 2000

[54] ELECTRONIC COMPONENT FEEDER

[75] Inventors: Seiichi Mogi, Izumiohtsu; Wataru Hirai, Osaka; Kunio Sakurai, Sakai; Minoru Yamamoto, Osaka; Youichi Makino; Akiko Ida, both of Neyagawa, all of Japan

[73] Assignee: Matsushita Electric Industrial Co., Ltd., Osaka, Japan

[21] Appl. No.: 08/981,773

[22] PCT Filed: May 13, 1997

[86] PCT No.: PCT/JP97/01600

§ 371 Date: Jan. 8, 1998

§ 102(e) Date: Jan. 8, 1998

[87] PCT Pub. No.: WO97/43890

PCT Pub. Date: Nov. 20, 1997

[30] Foreign Application Priority Data

May 13, 1996 [JP] Japan .................................. 8-117680

[51] Int. Cl.⁷ ............................................ B65H 5/28
[52] U.S. Cl. ............................ 156/584; 156/344; 221/25; 221/79; 221/87; 226/8; 414/411; 414/416
[58] Field of Search ................................ 156/344, 584; 221/25, 72, 79, 87; 226/8, 120; 414/411, 416

[56] References Cited

U.S. PATENT DOCUMENTS

| | | |
|---|---|---|
| 4,687,152 | 8/1987 | Hawkswell . |
| 4,756,073 | 7/1988 | Hawkswell . |
| 5,116,454 | 5/1992 | Kurihara ................. 156/584 |
| 5,492,593 | 2/1996 | Ariga et al. ............. 156/584 |
| 5,598,986 | 2/1997 | Ando et al. . |
| 5,658,122 | 8/1997 | Ohashi et al. ....... 156/584 X |
| 5,695,309 | 12/1997 | Kondo et al. ............ 414/416 |
| 5,725,140 | 3/1998 | Weber et al. ............ 226/139 |

FOREIGN PATENT DOCUMENTS

| | | |
|---|---|---|
| 0751702 | 1/1997 | European Pat. Off. . |
| 0876091 | 11/1998 | European Pat. Off. . |

*Primary Examiner*—Mark A. Osele
*Attorney, Agent, or Firm*—Jordan and Hamburg LLP

[57] ABSTRACT

An electronic component feeder is provided for feeding electronic components in their stable position into an electronic component mounting apparatus and allowing the taking up of a top tape with high stability thus increasing the speed of component mounting action. As the top tape (4) is being taken up on a reel (42), a shutter (34) moves backward together with a slit (51) provided integral on the shutter (34). The turning in the tape take-up direction of the reel (42) is driven by the restoring force of a return spring (39). When the reel (42) has completed its take-up motion, the electronic component (1) can be picked up at a component pick-up location with the shutter (34) staying backward. A stationary roller (31) is provided between the slit (51) and the reel (42) and a movable roller (32) is provided for keeping the length of the top tape (4) between the slit (51) and the stationary roller (31) substantially constant.

6 Claims, 14 Drawing Sheets

ELECTRONIC COMPONENT FEEDER

TECHNICAL FIELD

The present invention relates to an electronic component feeder attached for use in an electronic component mounting apparatus.

BACKGROUND ART

A conventional electronic component feeder is explained referring to FIGS. 9 to 15.

Such an electronic component feeder is commonly designed for supplying electronic components 1 from an electronic component carrying tape A shown in FIG. 9. This is not only because components 1 can be aligned in a row which is advantageous for continuous supply but also because such tape allows easy conveying and handling by an operator.

The electronic component carrying tape A shown in FIG. 9 includes a holder tape 3 having a row of storage recesses 2 provided therein at equal intervals in a lengthwise direction, the electronic components 1 stored in their respective storage recesses 2, a top tape 4 attached to the upper surface of the holder tape 3 for protecting and preventing electronic components 1 from dropping off, and a row of sprocket apertures 5 provided at equal intervals in a lengthwise direction.

For supplying the electronic components 1 from the electronic component carrying tape A, it is necessary to repeat a cycle of actions comprising three steps; peeling off the top tape 4, holding the electronic component 1 with a suction nozzle, and advancing the electronic component carrying tape A by a distance equal to the distance between any two adjacent storage recesses 2.

Such cycle of actions carried out in a conventional electronic component feeder installed in an electronic component mounting apparatus will now be described in more detail referring to FIGS. 10 to 15.

Motions of each element of the component feeder in accordance with actions of the suction nozzle will be described according to the timing chart shown in FIG. 13 as well as referring to the front view in FIG. 10, the rear view in FIG. 11, and the plan and cross sectional views of a tip of the component feeder in FIG. 12.

As shown in FIG. 13, each element repeats component feeding actions in accordance with a cycle of actions consisting of descending, attracting components by suction, and ascending of the suction nozzle in the electronic component mounting apparatus.

Referring to FIGS. 10 to 12, in response to the actions of the suction nozzle, an actuator lever (not shown) comes into contact with a feed lever 6 (denoted by oblique lines in FIG. 10) which then turns down clockwise about a first pivot center 16 as shown in FIG. 10. As the feed lever 6 has turned down a given distance, it strikes a take-up lever 11 which then turns up clockwise as shown in FIG. 10.

One cycle of actions the feed lever 6 which consists of descending, pausing, and ascending is converted by a link 7 to the forward and backward turning motion of a wheel driving lever 18 about a second pivot center 19.

Through a combination of a first pin 20 fitted into a hole 24a of a shutter 24 mounted to the wheel driving lever 18, second pins 22, 22 mounted to the tape guide 12, and a slot 23 provided in the shutter 24 for engagement with and guidance of the two second pins 22, the forward and backward turning action of the wheel driving lever 18 is converted to an intermittent linear reciprocating movement of the shutter 24. The shutter 24 has a distal end 24b bent down as best shown in FIGS. 12A and 12B so that it can reciprocate intermittently on the tape guide 12 without covering the entirety of a suction window 25 provided at a component pick-up position of the tape guide 12 but holding a central position of the electronic component 1 exposed to the suction window 25. The distal end 24b of the shutter 24 remains retracted in a gap 24a defined in the tape guide 12 when the suction window 25 is not closed with the shutter 24.

Accordingly, as shown in FIGS. 11 to 13, when the feed lever 6 is started to turn downwardly, the shutter 24 moves backward to the right-hand side in FIG. 11, allowing the distal end 24b thereof to retreat into the gap 24a. As the actuator lever in the electronic component mounting apparatus stops at its given position, the turning movement of the feed lever 6 is ceased thus to halt the take-up lever 11 and the shutter 24. Since the shutter 24 is at this time in its retracted position, the suction window 25 of the tape guide 12 is fully opened.

The suction window 25 has a larger opening area than for picking up the component 1. When the suction window 25 is open, the electronic component 1 is located substantially at the center of the suction window 25.

The suction nozzle which has been lifted down then picks up the electronic component 1 and moves upward.

The upward movement of the suction nozzle triggers an upward turning action of the actuator lever of the electronic component mounting apparatus. The feed lever 6 accompanies the upward motion of the actuator lever by the function of a return spring 9 and turns counterclockwise about the first pivot center 16 in FIG. 10. As the feed lever 6 turns upward, it departs from the take-up lever 11 which is thus driven by the pulling force of a return spring 10 to descend counterclockwise in FIG. 10.

The take-up lever 11 and the reel 8 are mounted on a common axis about the first pivot center 16 and provided with a known one-directional rotary ratchet mechanism. As shown in FIG. 10, the counterclockwise turning of the take-up lever 11 directs the counterclockwise turning of the reel 8. When the take-up lever 11 is turned clockwise, the one-directional rotary ratchet mechanism causes the reel 8 to rest. Accordingly, the pulling force of the return spring 10 exerted on the take-up lever 11 becomes a force for turning the reel 8 counterclockwise and thus a force for taking up the top tape 4. The top tape 4 is peeled off from the upper surface of the holder tape 3 by this force at the slit 13 of the tape guide 12 when the electronic component carrying tape A is conveyed in the direction denoted by the arrow in FIG. 10 and taken up via a stationary roller 15 around the reel 8.

Simultaneously, the wheel driving lever 18 turns counterclockwise in FIG. 11 about the second pivot center 19 and its turning drives the shutter 24 to move to the left-hand side in FIG. 12A and close the suction window 25.

The wheel driving lever 18 and a wheel 21 turn about the common second pivot center 19 and are provided with a known one-directional rotary ratchet mechanism between them. Only when the wheel driving lever 18 turns counterclockwise in FIG. 11, the wheel 21 is rotated in the same direction together with the lever 18. The wheel 21 has a plurality of pins 21a provided at equal intervals of a pitch on the circumference thereof for engagement with the sprocket apertures 5 of the holder tape 3. With the forward movement of the shutter 24 to the left-hand side in FIG. 12A the wheel 21 turns counterclockwise FIG. 11, the pins 21a at its circumferential edge engaging with the sprocket apertures 5 of the holder tape 3, thereby driving the holder tape 3 in the turning direction of the wheel 21.

At this time, the top tape 4 which has been urged by the peeling force departs from the upper surface of the holder tape 3 as shown in FIG. 10 and is taken up by the reel 8 via the stationary roller 15. As the feed lever 6 stops at its upper limit, the wheel driving lever 18 comes to a halt, and so do the shutter 24 and the electronic component carrying tape A.

When the reel 8 has taken up the top tape 4, its action stops upon the tension on the top tape 4 being balanced with the take-up force. At the time of completing its action, the take-up lever 11 rests at the position away from the feed lever 6 and remains urged counterclockwise in FIG. 10 by the yielding force of the return spring 10. Such resting position of the take-up reel 11 is varied depending on the taken-up quantity of the top tape 4 on the reel 8, i.e, the diameter of the taken-up tape.

FIG. 14 illustrates a holding member 14 for elastically holding down the tape guide 12 onto a feeder body 17. While the electronic component carrying tape A conveys the electronic components 1 stored in their respective recesses 2 of its holder tape 3 and held under the top tape 4 as mentioned above, the tape guide 12 assists the electronic components 1 to stay in their respective recesses 2 before the electronic components 1 are picked up by the suction nozzle after removal of the top tape 4. Also, the tape guide 12 prevents the electronic component carrying tape A from lifting up, loosening, or displacing upon the top tape 4 being peeled off. The holding member 14 is pivotally supported by a pivot 14*b* and urged by a spring 26 to inhibit the lifting motion of the tape guide 12.

As shown in FIG. 10, the actuator lever of the electronic component mounting apparatus travels two, large and small, distances d and c to strike and cause the feed lever 6 to descend clockwise in FIG. 10 about the first pivot center 16. There are hence provided two types of electronic component feeder for allowing the feed lever 6 to move a small stroke c' in response to a motion of the actuator lever by the small distance c and a large stroke d' in response to a motion of the actuator lever by the large distance d.

In the former type of electronic component feeder in which the feed lever 6 moves a smaller stroke c', the feed lever 6 is constructed such as to be able to move the large stroke d' so that it can follow an erroneous motion by the large distance d of the actuator lever for preventing any damage of the electronic component feeder.

As explained, the conventional electronic component feeder allows the take-up lever 11 to be turned counterclockwise in FIG. 10 in response to the returning motion of the feed lever 6 thus rotating the reel 8 in the same or take-up direction to take up the top tape 4. The angle of rotation of the reel 8 and the take-up lever 11 varies depending on the amount of taken up top tape 4 on the reel 8. When the diameter of the taken up quantity of the top tape 4 is small, the angle of rotation is large. If the diameter of the taken up quantity is large, the angle of rotation is small. Since the angle of rotation is not constant, the feed lever 6 and the take-up lever 11 which are detachable from each other turn together in an early stage of the motion, where the feed lever 6 turns counterclockwise in FIG. 10 and the take-up lever 11 turns in the same direction. Upon the top tape 4 having been taken up, the take-up lever 11 stops its motion and the feed lever 6 continues its turning motion to depart from the take-up lever 11 before coming to a halt as shown in FIG. 15A.

As the feed lever 6 turns in the forward direction, it travels clockwise in FIG. 10 and FIG. 15A, hits against a contact point 28 of the take-up lever 11 on its way, and further moves together with the take-up lever 11 in the clockwise direction. As previously mentioned, the take-up lever 11 rotates clockwise in FIG. 10 freely from the reel 8 which is pausing.

Such hitting occurs when the shutter 24 is at its retracted position as shown in FIG. 13. In other words, the strike occurs at a moment just before the suction window 25 is opened. Hence, the impact or vibration generated by at the striking may shake the electronic component 1 held without any protecting force and located in the center of the opened suction window 25 and if worse, allow it to jump out from the storage recess 2 or turn to a vertical state. Minute electronic components 1 are more liable to be affected by such impact or vibration especially as the speed of mounting operation is increased, which causes a decline in the picking up capability of the suction nozzle.

As shown in FIG. 14, the tape guide 12 and the holding member 14 are contacted with each other at a point 27 where an extension 12*a* of the tape guide 12 touches a projection 14*a* of the holding member 14. However, such structure does not allow the holding member 14 and the tape guide 12 to smoothly contact with each other at the contact point 27, and the force of the spring 26 for holding down the tape guide 12 is not efficiently transmitted thereto.

When the tape guide 12 is lifted up from the electronic component carrying tape A for some reasons such that the suction nozzle fails to pick up the electronic component 1 or that the electronic component 1 drops down between the holder tape 3 and the tape guide 12, the force of the spring 26 for holding down the tape guide 12 cannot swiftly follow up because of the poor condition of smoothness at the contact point 27. Accordingly, a gap beneath the tape guide 12 will not be eliminated immediately even after the electronic component 1 has been removed out by the advancing movement of the tape A. The electronic components 1 locating between a position where the top tape 4 has been peeled off and a pick-up position thus lose the holding down force above them, by which their postures may be disturbed thus lowering the efficiency of picking up action.

In the electronic component feeder in which the feed lever 6 moves the small stroke c', the feed lever 6 is constructed to be able to move the large stroke d' in order to prevent any damage in the event that the actuator lever of the electronic component mounting apparatus moves the large stroke d erroneously. This causes such problem as described below. When setting the electronic component carrying tape A into the electronic component feeder with the small stroke c', the feed lever 6 is manually moved. It is, however, difficult to cause the feed lever 6 to move precisely by the stroke c' and stop there. In case that the feed lever 6 is moved further from the small stroke c', the electronic component carrying tape A travels an excessive distance hence releasing two or more of the electronic components 1 at once and producing a loss. In addition, the peeling off of top tape 4 is interrupted on the way and the top tape 4 may be conveyed together with the holder tape 3 and stuck between the tape guide 12 and the feeder body 17.

When the actuator lever in the electronic component feeder designed for the small stroke c' mounted in electronic component mounting apparatus is moved accidentally by the large stroke d due to setting errors of the program, the feed lever 6 is returned by the large stroke d' to its initial position in the counterclockwise direction. This will delay the identification of such setting errors in the program of the electronic component mounting apparatus. Also, the amount of movement of the shutter 24 is increased, causing a critical collision between the shutter 24 and the suction nozzle.

DISCLOSURE OF INVENTION

An electronic component feeder according to the present invention comprises: a wheel for conveying a holder tape of an electronic component carrying tape by intermittent rotation in one direction and for feeding electronic components stored in their respective storage recesses on the holder tape in sequence to a component pick up position; a reel for taking up a top tape for peeling off the top tape from the holder tape of the electronic component carrying tape; a tape guide for receiving and guiding the electronic component carrying tape; a shutter which is supported and guided by the tape guide and moves forward and backward in such a way that the shutter covers the electronic components from above stored in the storage recesses of the holder tape after the top tape has been peeled off and clears above the component pick-up position for allowing the electronic component to be picked up only when the shutter is at its retreated position; a slit provided integral with the shutter for passing and directing the top tape peeled off from the holder tape to the reel; a feed lever which, on receipt of a driving force from an electronic component mounting apparatus, repeats intermittent reciprocating rotation consisting of forward turning motion, pause, and backward turning motion about a pivot center which is identical with that of the reel; a power transmitting means for converting the intermittent reciprocating rotation of the feed lever to intermittent one-directional turning movements of the wheel, in such a way that the wheel is turned only when the feed lever turns backward to advance the holder tape; a power transmitting means for converting the intermittent reciprocating rotation of the feed lever to intermittent forward and backward movements of the shutter, in such a way that the shutter is moved backward when the feed lever turns forward and the shutter is moved forward when the feed lever turns backward; a take-up lever which rotates forward and backward about the pivot center which is identical with that of the reel; a spring for giving a bias to cause the take-up lever to rotate in the tape take-up direction; a take-up lever driving member driven by the feed lever for moving detachably to and from the take-up lever so that the take-up lever driving member moves away from the take-up lever when the feed lever turns forward so as to allow the take-up lever to rotate by the urging force of the spring in the tape take-up direction and that when the feed lever turns backward, the take-up lever driving member approaches and contacts the take-up lever and further causes the take-up lever to rotate in a direction opposite to the tape take-up direction; and a one directional power transmitting means for transmitting the rotation in the tape take-up direction of the take-up lever to the reel so as to cause the reel to rotate in the tape take-up direction while not transmitting the rotation in a opposite direction of the take-up lever to the reel so as to allow the take-up lever to rotate freely.

According to the present invention described above, with the forward rotation of the feed lever, the reel is turned in the tape take-up direction to take up the top tape, at the same time when the slit provided in the shutter is moved backward thus ensuring the smooth motion of peeling off and taking up the top tape. Also, since the take-up lever is driven by the urging force of the spring for turning the reel in the tape take-up direction, the generation of shock or vibration caused by the take-up lever striking immediately before the electronic component is picked up as in a prior art will be avoided. The shutter then opens above the component pick-up position when the feed lever is pausing, allowing the electronic component to be picked up by a suction nozzle or the like. At this time, as there has not been generated any shock or vibration, the electronic component can be maintained in its correct, stable position. This permits the electronic component to be picked up by the suction nozzle with high efficiency and steadiness. When the feed lever turns backward, the wheel is driven to advance the electronic component carrying tape along with the shutter. As the top tape is not peeled off during such advancing movement and the electronic component exposed in the storage recess is protected by the shutter which is moving along in synchronism. Accordingly, the electronic component can be kept stable in position during the advancing movement of the electronic component carrying tape. Although the take-up lever driving member strikes the take-up lever in the backward turning motion of the feed lever, its striking action occurs after the electronic component is picked up and will hardly produce an adverse effect.

The electronic component feeding apparatus may further comprise a stationary roller for guiding the top tape peeled off to the reel and a movable roller provided in the middle between the slit and the stationary roller for keeping the length of the top tape between the slit and the stationary roller substantially constant. Due to the function of the movable roller which holds the top tape with a certain margin, even when the shutter is advanced together with the electronic component carrying tape thus causing the slit provided in the shutter to advance during the backward rotation of the feed lever while the reel is pausing, the movable roller adjusts its position by moving an amount equal to the distance the slit has moved, preventing an excessive stretching tension from being exerted to the peeled off top tape thereby preventing the top tape from being cut. The above described function of the movable roller can be properly effected with the aid of the stationary roller irrespective of the diameter of the top tape taken up around the reel.

The movable roller may be provided integral with the feed lever for simplification of the entire construction.

It may preferably be arranged that the tape guide is resiliently pressed against a feeder body via a holding member in such a way that the tape guide and the holding member are directly joined to each other by a roller. As the friction between the tape guide and the holding member is reduced by the roller, the traceability of the tape guide to the electronic component carrying tape is highly improved and the electronic component carrying tape can be conveyed more stably. Accordingly, electronic component carrying tapes of any type can be dealt with irrespective of the thickness of the tape which varies depending on types of electronic components carried thereon. It is thus possible to improve the component picking up efficiency by suction, to enhance the ability to cope with more minute electronic components, and to increase the mounting speed.

Also, an electronic component feeder according to the present invention comprises: a wheel for conveying a holder tape of an electronic component carrying tape by intermittent rotation in one direction and for feeding electronic components stored in their respective storage recesses on the holder tape in sequence to a component pick up position; a reel for taking up a top tape for peeling off the top tape from the holder tape of the electronic component carrying tape; a tape guide for receiving and guiding the electronic component carrying tape; a shutter which is supported and guided by the tape guide and moves forward and backward in such a way that the shutter, clears above the component pick-up position for allowing the electronic component to be picked up only when the shutter is at its retreated position; a slit provided behind the component pick up position for passing and directing the top tape peeled off from the holder tape to the reel; a feed lever which, on receipt of a driving force from an electronic component mounting apparatus, repeats intermittent reciprocating rotation consisting of forward turning motion, pause, and backward turning motion about a pivot center which is identical with that of the reel; a power transmitting means for converting the intermittent reciprocating rotation of the feed lever to intermittent one-directional turning movements of the wheel; a power transmitting means for converting the intermittent reciprocating rotation of the feed lever to intermittent forward and backward movements of the shutter; a power transmitting means for converting the intermittent reciprocating rotation of the feed lever to a tape take-up motion of the reel; and a stopper for giving a rotation inhibiting resistance to the feed lever at a specific position when the feed lever rotated more than a given amount and for stopping the rotation of the feed lever in its returning rotation at the specific position in the event that the feed lever overcomes the rotation inhibiting resistance and further rotates in the forward direction.

According to the present invention described above, when the electronic component carrying tape is loaded by hand to the electronic component feeder and the feed lever is inadvertently turned more than necessary amount, the stopper hits and stops the feed lever. This allows the feed lever to be manually turned only by the requisite amount for advancing the electronic component carrying tape by a predetermined distance for feeding only one of the electronic components at a time. Accordingly, the loss of the electronic components will be minimized and the replacement of the electronic component carrying tape with a new one will be conducted with much ease.

In case that the actuator lever is turned more than necessary amount due to setting errors in a program of the electronic component mounting apparatus in which the electronic component feeder is installed, the feed lever hits the stopper and stops by the function of the return spring and does not return to its initial position after rotating by the excessive amount. Component feeding operation is thereby interrupted, by which the setting errors of the program can be found at an earlier stage and damages to the suction nozzle can be prevented.

BEST MODES FOR CARRYING OUT THE INVENTION

One embodiment of the present invention will be described referring to FIGS. 1 to 9.

Figure 9:
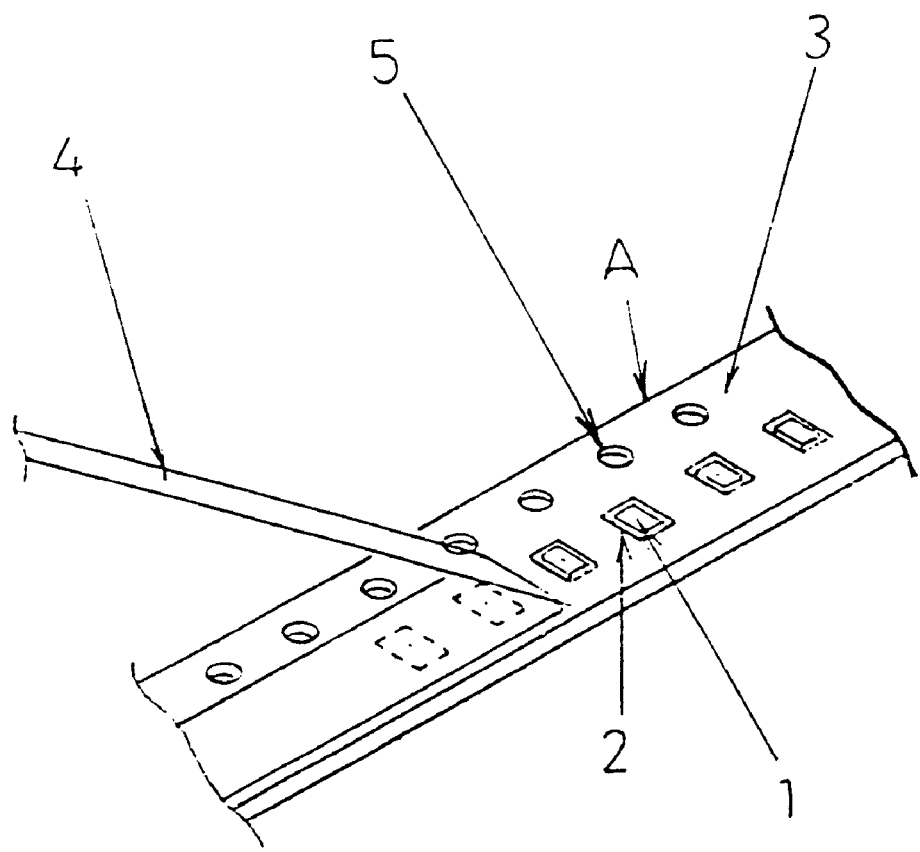
FIG. 9 is a perspective view of the structure of an electronic component carrying tape.

An electronic component carrying tape A used in the embodiment is identical to that of the prior art shown in FIG. 9 and will be explained in no more detail.

Figure 1:
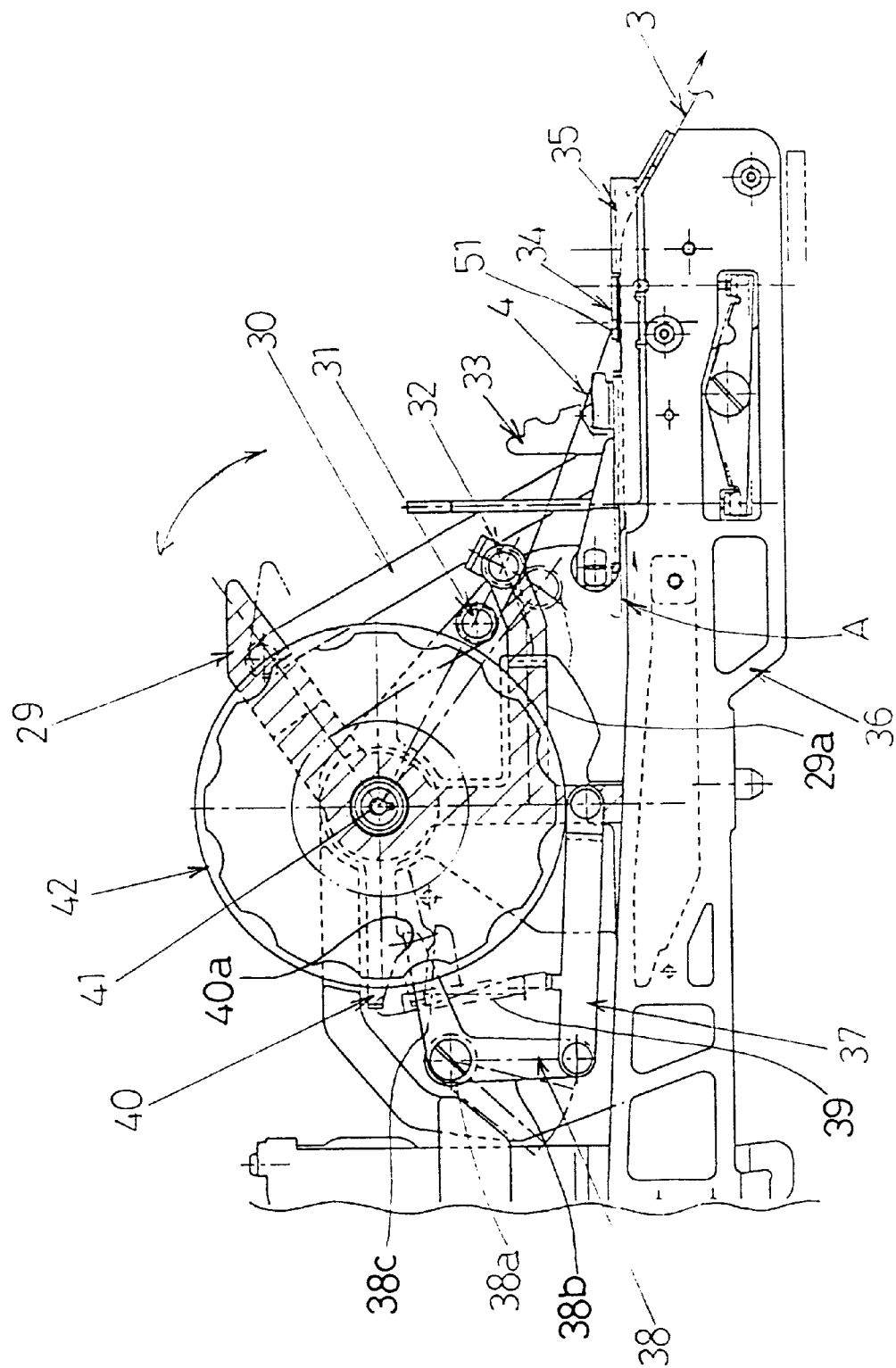
FIG. 1 is a front view showing one embodiment of the present invention.

A feed lever 29 denoted by oblique lines in FIG. 1 is constituted for intermittent and reciprocating rotation about a first pivot center 41. The feed lever 29 is driven by the action of an actuator lever 62 (FIG. 8) in an electronic component mounting apparatus and the restoring force of a return spring 43 (FIGS. 2 and 8) for turning forward, pausing, and turning backward in accordance with the downward motion, pause, and upward motion of the actuator lever 62. More particularly, at the same time when a suction nozzle of the electronic component mounting apparatus is lifted down, the actuator lever 62 is lowered and comes into direct contact with the feed lever 29 which then turns about the first pivot center 41 clockwise for downward (forward) movement as shown in FIG. 1. When the suction nozzle picks up an electronic component at its lower limit position, the actuator lever 62 also remains stationary at its lower limit position as well as the feed lever 29 is paused. When the suction nozzle is lifted up, the actuator lever 62 moves upward. At this time, the feed lever 29 is driven by the restoring force of the return spring 43 to turn counterclockwise in FIG. 1 about the first pivot center 41 for upward movement (backward rotation).

Figure 2:
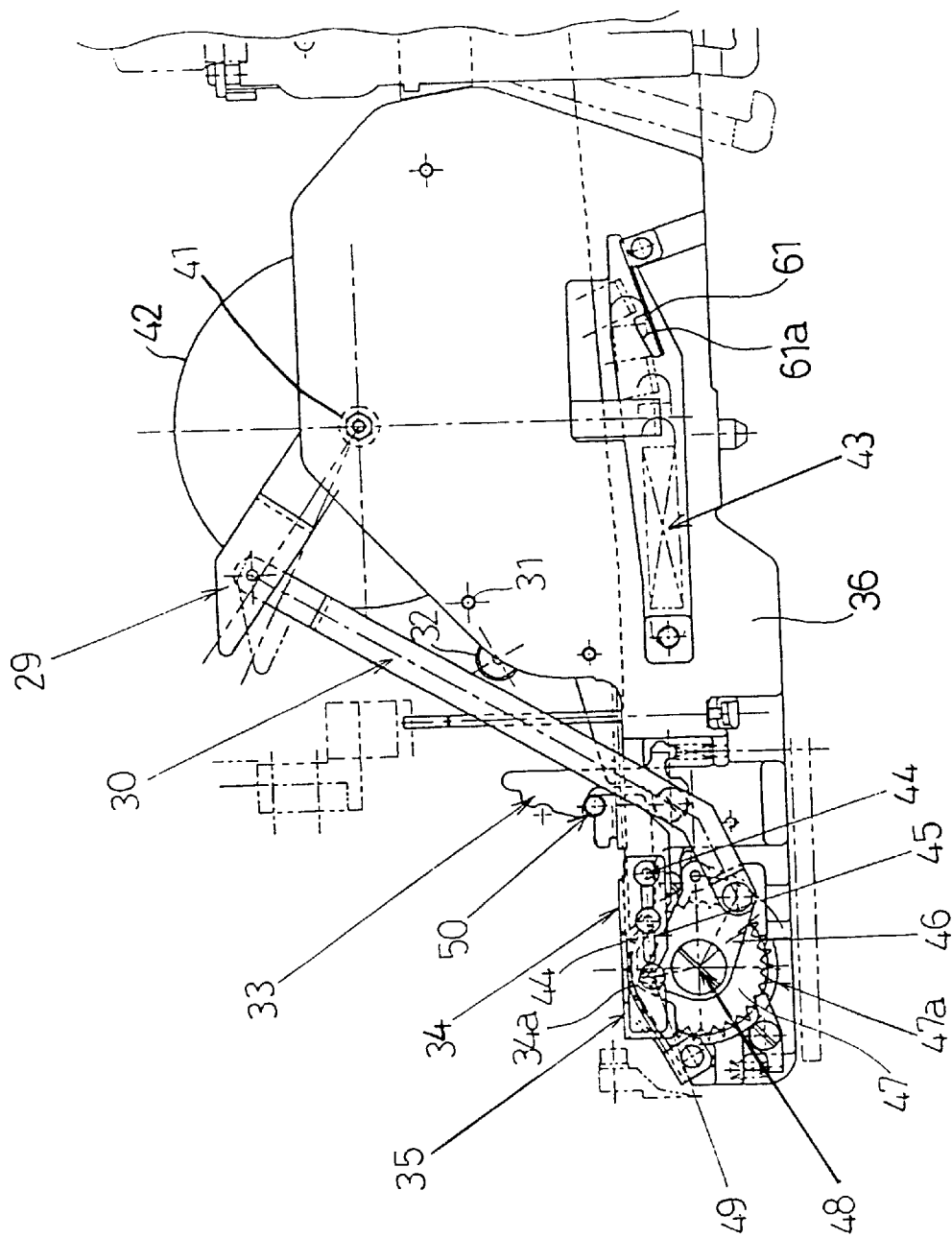
FIG. 2 is a back view of the embodiment.

A wheel 47 is constructed identical to that of the prior art as shown in FIG. 2, which rotates intermittently in one direction to convey a holder tape 3 of the electronic component carrying tape A and feed the electronic components 1 stored in their respective recesses 2 of the holder tape 3 one by one to the picking up position. The wheel 47 is driven for advancing the holder tape 3 by the backward rotation of the feed lever 29. A power transmitting means for shifting the intermittent reciprocating movements of the feed lever 29 to the intermittent one directional rotation of the wheel 47 is also constituted similarly with the prior art.

Specifically, the wheel 47 and the power transmitting means are constructed as described below. Referring to FIG. 2, the wheel 47 rotates about a second pivot center 48. The feed lever 29 is joined by a link 30 to a wheel driving lever 46 which turns about the second pivot center 48. The forward rotation, pause, and backward rotation of the feed lever 29 are shifted to the clockwise motion, pause, and counterclockwise motion of the wheel driving lever 46 shown in FIG. 2. A known one-directional rotary ratchet mechanism is mounted between the wheel driving lever 46 and the wheel 47 for transmitting a force of rotation to the wheel 47 only when the wheel driving lever 46 turns counterclockwise in FIG. 2. The wheel 47 has a plurality of pins 47a mounted at equal intervals of a pitch at the circumferential edge thereof for engagement with a row of sprocket apertures 5 provided in the holder tape 3.

Accordingly, as the feed lever 29 turns forward, the wheel driving lever 46 is turned clockwise in FIG. 2. Since the wheel driving lever 46 rotates freely from the wheel 47, the wheel 47 remains stationary. The wheel 47 maintains to be stationary when the feed lever 29 is not driven. When the feed lever 29 turns backward, the wheel driving lever 46 is turned counterclockwise in FIG. 2 and its motion is transmitted by the one directional rotary ratchet mechanism to the wheel 47 which then turns counterclockwise in FIG. 2. The rotation of the wheel 47 causes the holder tape 47 engaged with the pins 47a and thus the electronic component carrying tape A to advance.

Figure 7:
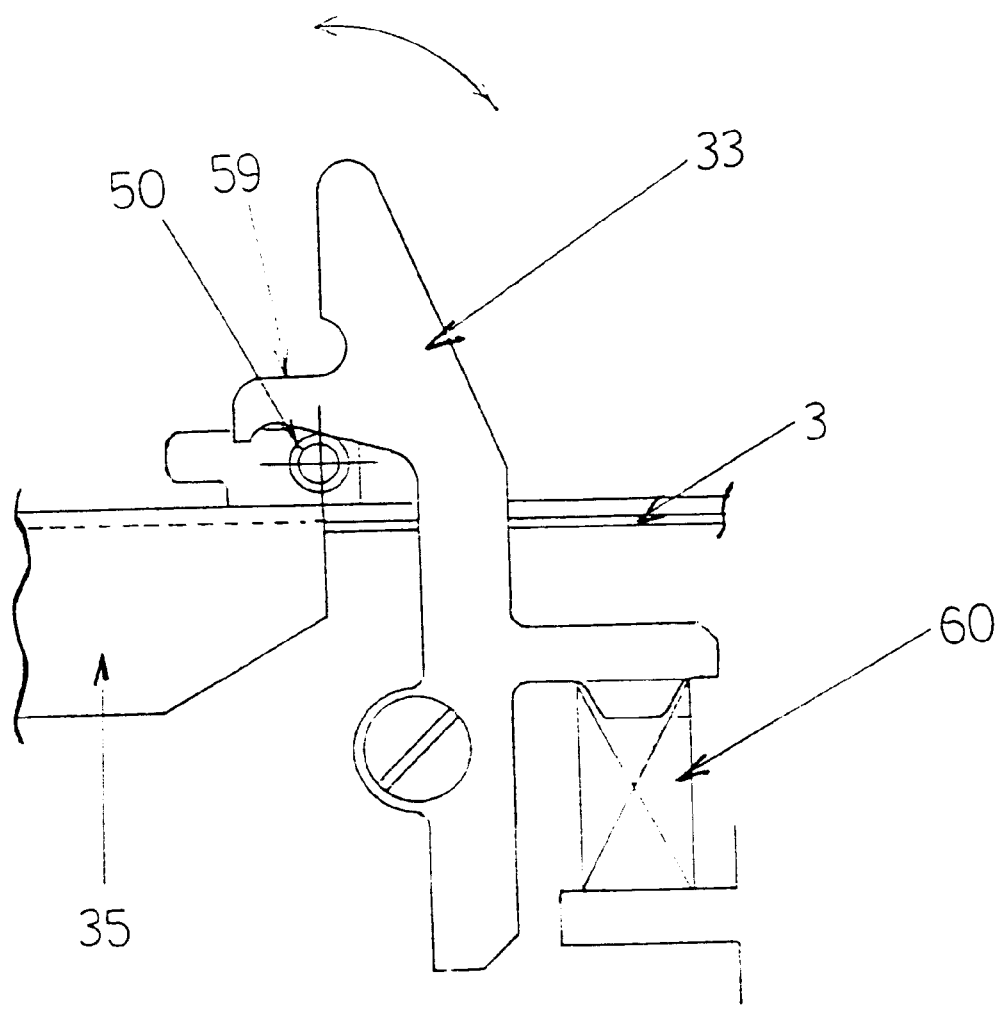
FIG. 7 is an enlarged view of a holding structure of a tape guide of the embodiment.

As shown in FIGS. 1, 2, 3, and 7, a tape guide 35 for accepting and guiding the electronic component carrying tape A is mounted to be resiliently urged against a feeder body 36. A holding member 33 which resiliently holds down the tape guide 35 includes a hold-down projection 59 for pressing a roller 50 mounted on the tape guide 35 and is driven by a hold-down spring 60 to press down the roller 50, as best shown in FIG. 7. The hold-down projection 59 has a rolling contact with the roller 50 providing a small resistance to friction and can quickly follow the upward and downward displacement of the tape guide 35.

Figure 3:
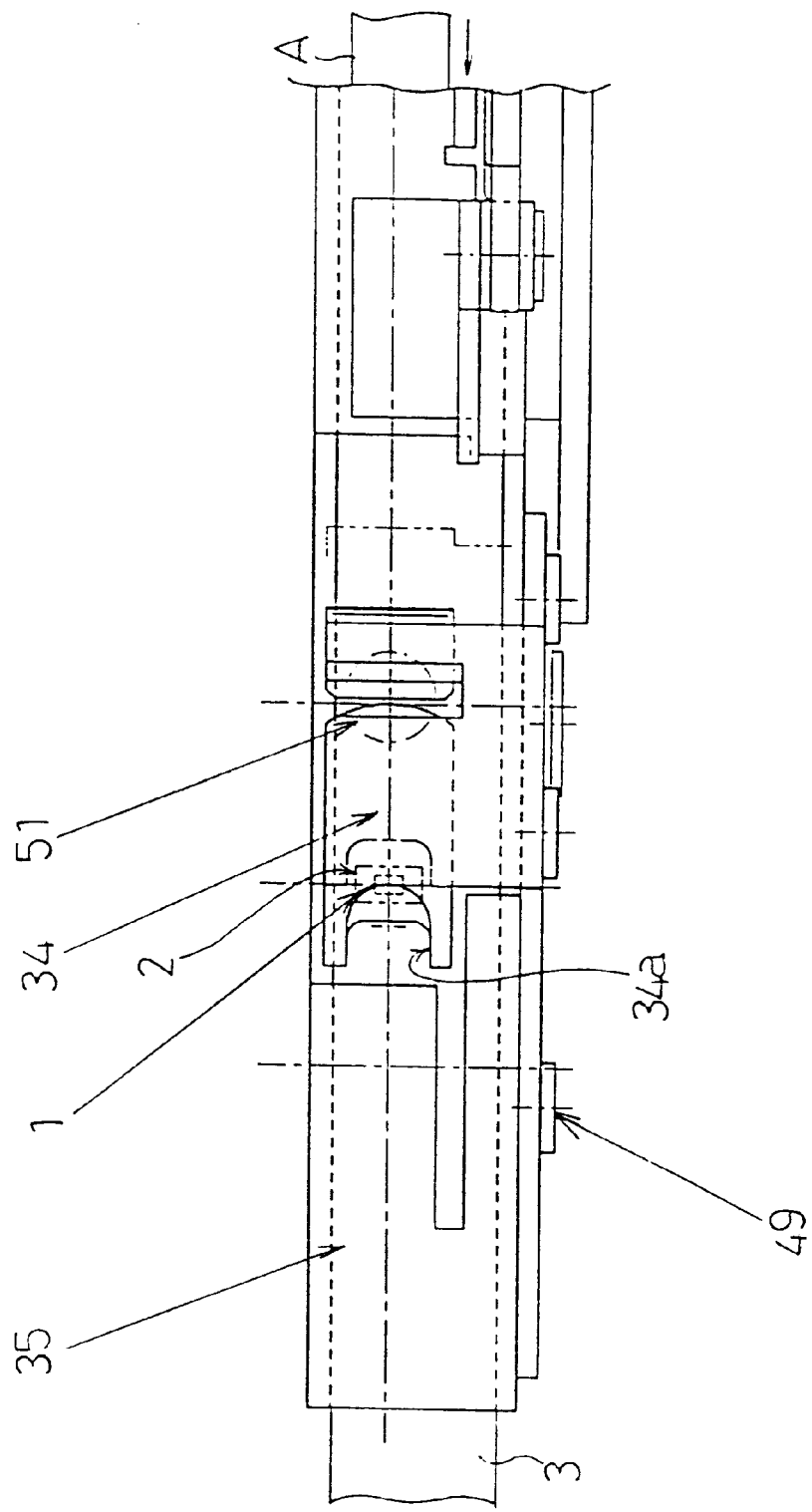
FIG. 3 is a plan view of a front end section of the embodiment.

The tape guide 35 has an opening provided in the upper side thereof for allowing the electronic component 1 to be picked up and for passing the top tape 4 peeled off from the holder tape 3 to a reel 42, as shown in FIG. 3. A shutter 34 is supported and guided by the tape guide 35 and moves forward and backward such that the shutter clears above the position for picking up the electronic component 1 when it is at its backward position. Unlike that of the prior art, the shutter 34 has a flat shutter construction. The shutter 34 is designed to cover the opening of the tape guide 35 and capable of moving forward and backward with a flat plane for protecting from above the electronic component 1 stored in the storage recess 2 of the holder tape 3 with the top tape 4 having been peeled off. As shown in FIG. 3, the shutter 34 has a component outlet 34a configured to be recessed form provided in a front portion thereof for allowing the electronic component 1 to be picked up when the shutter 34 is at its backward position. Also, the shutter 34 has a slit 51 provided therein at the back of the component outlet 34a for passing the top tape 4 peeled off from the holder tape 3 to the reel 42. The slit 51 formed integrally in the shutter 34 is one of the characteristics of the present invention different from the prior art.

The shutter 34 is moved backward when the feed lever 29 turns forward and paused when its turning stops for opening above the position for picking up components. The shutter 34 is moved forward when the feed lever 29 turns backward. A transmitting means for shifting the intermittent reciprocation of the feed lever 29 to the intermittent forward and backward movements of the shutter 34 is similarly constructed with that of the prior art. As explained, the forward rotation, pause, and backward rotation of the feed lever 29 are converted to the clockwise motion, pause, and counterclockwise motion of the wheel driving lever 46 shown in FIG. 2. The wheel driving lever 46 has a first pin 49 for engagement with the coupling recess 34a of the shutter 34 and also a slot 45 extending lengthwise therein. A pair of front and rear second pins 44 are mounted on the tape guide 35 for engagement with the slot 45 of the shutter 34. The first pin 49 is used for shifting the intermittent reciprocation of the wheel driving lever 46 to the forward and backward movements of the shutter 34 which are guided by the engagement between the slot 45 and the second pins 44.

The take-up reel 42 for taking up the top tape 4 peeled off from the holder tape 3 of the electronic component carrying tape A is intermittently rotated about the first pivot center 41 in the counterclockwise direction in FIG. 1 or in a direction for taking up the top tape 4. A take-up lever 40 is mounted to the first pivot center 41 for forward and backward rotation thereabout. In addition, an L shaped lever (take-up lever driving member) 38 is provided for forward and backward rotation about a third pivot center 38a. The L shaped lever 38 has a lower projection 38b joined by a link 37 to the feed lever 29. The L shaped lever also has a reel facing projection 38c which is movable to and from a contact point 40a of the take-up lever 40. The take-up lever 40 is joined by a return spring 39 to the link 37 and urged by the tensioning force of the return spring 39 in the counterclockwise direction in FIG. 1 or a direction for taking up the tape. Alternatively, the return spring 39 may be mounted between the take-up lever 40 and the feeder body 36 for urging the take-up lever 40 in the tape take-up direction.

A known one directional rotary ratchet mechanism (one directional rotation transmitting means) is mounted between the take-up lever 40 and the reel 42 for transmitting the rotation in the tape take-up direction of the take-up lever 40 to the reel 42 to turn the reel 42 in the tape take-up direction and for allowing the take-up lever 40 to be turned freely without transmitting the rotation of the take-up lever 40 in the reverse direction to the reel 42.

When the feed lever 29 turns in the clockwise direction (forward rotation) in FIG. 1, the L shaped lever 38 is moved via the link 37 in the clockwise direction in FIG. 1. As the reel facing projection 38c of the L shaped lever 38 rotates downward, it departs from the contact point 40a of the take-up lever 40. Since the take-up lever 40 is urged by the return spring 39, it is turned in the counterclockwise (tape take-up) direction in FIG. 1 in response to the movement of the L shaped lever 38. The rotation of the take-up lever 40 is then transmitted by the one directional rotary ratchet mechanism to the reel 42 which thus turns in the counterclockwise (tape take-up) direction in FIG. 1 for taking up the top tape 4. As the reel 42 has taken up a predetermined length of the top tape 4, it is balanced by the tension of the top tape 4 and paused due to the resisting effect of the tension. Accordingly, the rotation of the take-up lever 40 is ceased. The L shaped lever 38 continues to turn and finally stops at a given position when its reel facing projection 38c comes apart from the contact point 40a of the take-up lever 40.

On the other hand, when the feed lever 29 turns in the counterclockwise direction (backward rotation) in FIG. 1, the L shaped lever 38 is moved via the link 37 in the counterclockwise direction in FIG. 1. As the reel facing projection 38c of the L shaped lever 38 approaches and hits the contact point 40a of the take-up lever 40 which is then driven by the L shaped lever 38 to turn in the clockwise direction in FIG. 1 (opposite to the tape take-up direction) before stopping at the given position. While the take-up lever 40 is being turned, the reel 42 is disconnected and remains resting. At the same time, the return spring 39 stretches to restore its resilient energy.

As explained above, the reel 42 is turned by the forward rotation of the feed lever 29 for taking up the top tape 4 which is one of the characteristics of this embodiment different from the prior art in which the reel is turned for taking up the top tape when the feed lever rotates backward. Also, the arrangement that the L shaped lever 38 strikes the take-up lever 40 and drives it to turn backward during the backward motion of the feed lever 29 is an advantageous feature which is absent in the prior art.

The top tape 4 of the electronic component carrying tape A is taken up by the rotation of the reel 42 in the tape take-up direction and peeled off from the holder tape 3 upon changing its advancing direction through the slit 51. The top tape 4 guided out from the slit 51 is led to the reel 42 by a movable roller 32 and a stationary roller 31 shown in FIG. 1. The stationary roller 31 is fixedly mounted to a particular position in the feeder body 36. The movable roller 32 is located between the slit 51 and the stationary roller 31 for deflecting the top tape 4 between the slit 51 and the stationary roller 31 and also arranged movable for varying the angle of the deflection. The movable roller 32 moves in relation to the slit 51 so that the length of the top tape 4 between the slit 51 and the stationary roller 31 is substantially constant regardless of the movement of the shutter 34 in which the slit 51 is provided. More specifically, the movable roller 32 is joined to the distal end of a shutter facing arm 29a of the feed lever 29 as shown in FIG. 1.

As explained above, in this embodiment, the reel 42 is turned in the tape take-up direction for taking up the top tape 4 when the feed lever 29 rotates forward and at the same time the shutter 34 is retracted backward. At this time, the wheel 47 remains stationary thus allowing the holder tape 3 to be paused. For smoothly peeling off the top tape 4 from the holder tape 3 which is paused, the slit 51 is integrally formed in the shutter 34 so that it can move therewith. This allows the top tape 4 to be advanced by a distance equal to the backward movement of the slit 51 thus being successfully peeled off from the holder tape 3 and taken up on the reel 42.

When the feed lever 29 turns backward, the shutter 34 and its slit 51 are moved forward while the reel 42 is paused and the wheel 47 is turned to advance the holder tape 3. Therefore, if the movable roller 32 was not provided, the top tape 4 would be cut by the forward motion of the slit 51. For eliminating such an adverse event, the movable roller 32 is provided and its action will be explained in more detail referring to FIG. 5.

Figure 5:
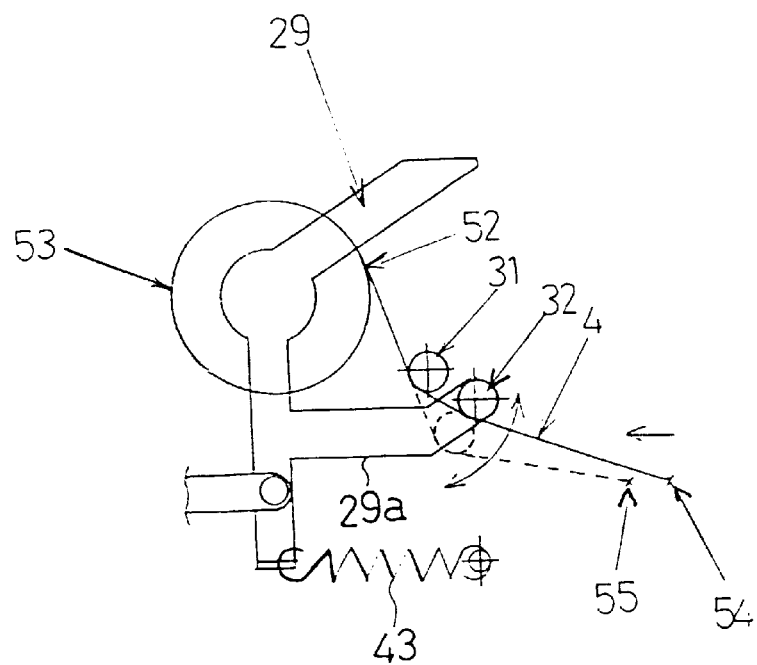
FIG. 5 is a model view of a top tape take-up mechanism of the embodiment.

As shown in FIG. 5, the solid lines represent the position of the movable roller 32 and the state of the top tape 4 when the slit 51 is located at its forward position 54. The broken lines represent the position of the movable roller 32 and the state of the top tape 4 when the slit 51 is at the backward position 55. When the feed lever 29 turns forward, the movable roller 32 is moved downwardly in FIG. 5 in accordance with the backward motion of the slit 51 so that the deflection of the top tape 4 between the stationary roller 31 and the slit 51 is increased in angle. On the other hand, when the feed lever 29 turns backward, the movable roller 32 is moved upwardly in FIG. 5 in accordance with the forward motion of the slit 51 so that the deflection of the top tape 4 is decreased allowing the smooth forwarding action of the slit 51. In any states shown by solid lines or broken lines or in an inbetween state in FIG. 5, the movable roller 32 is adjusted so that the length of the top tape 4 between the slit 51 and the stationary roller 31 is kept substantially constant. Accordingly, the top tape 4 will be prevented from being cut apart by the forward motion of the slit 51.

Figure 6:
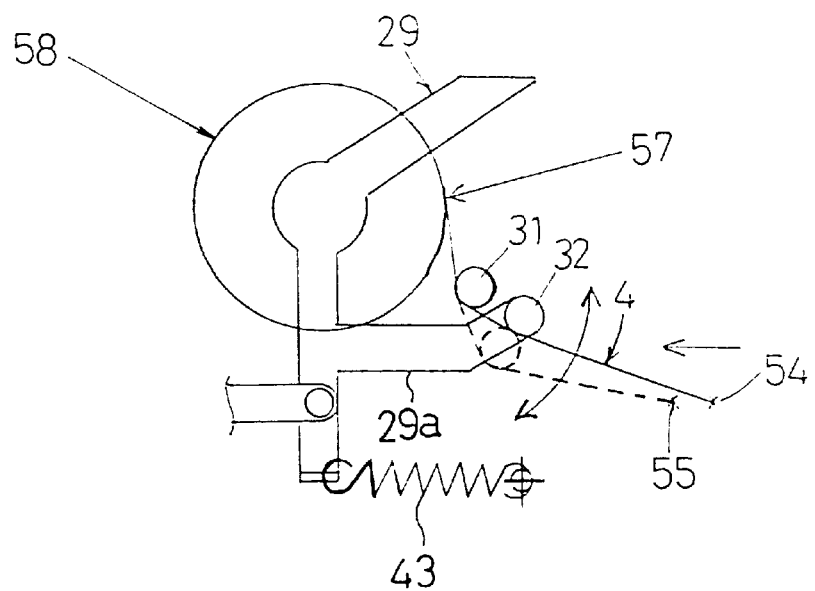
FIG. 6 is a model view of the top tape take-up mechanism of the embodiment.

The stationary roller 31 is designed for ensuring the action of the movable roller 32. FIG. 5 illustrates a case in which the roll 53 of taken up top tape 4 on the reel 42 is small in diameter, whereas FIG. 6 shows another case in which the roll 58 is large. As apparent from the comparison between FIGS. 5 and 6, the points 52 and 57 of the top tape 4 tangent to the rolls 53 and 58 on the reel 42 respectively are different from each other depending on the diameter of the rolls 53 and 58. If the movable roller 32 is provided without the aid of the stationary roller 31, its position will hardly be controlled to maintain the length of the top tape 4 between the slit 51 and the point on the roll 53 or 58 substantially constant. The stationary roller 31 is provided for preventing variation of the roll 53 or 58 from affecting directly on the control of the movable roller 32. Accordingly, the smooth forward and backward motion of the slit 51 or the shutter 34 will be guaranteed with the help of a simple construction where the feed lever 29 is provided with the movable roller 32.

Referring to FIGS. 2 and 8, a stopper 61 is provided for preventing an excessive rotation of the feed lever 29. If the feed lever 29 turns more than a predetermined distance, the stopper 61 provides resistance to inhibit the rotation of the feed lever 29 at a predetermined rotating position e. In the event that the feed lever 29 overcomes the resisting force and turns further in the forward direction, the stopper causes the feed lever 29 to stop at a given position f in its backward rotation. The action of the stopper 61 will be explained in more detail referring to FIG. 8.

Figure 8A:
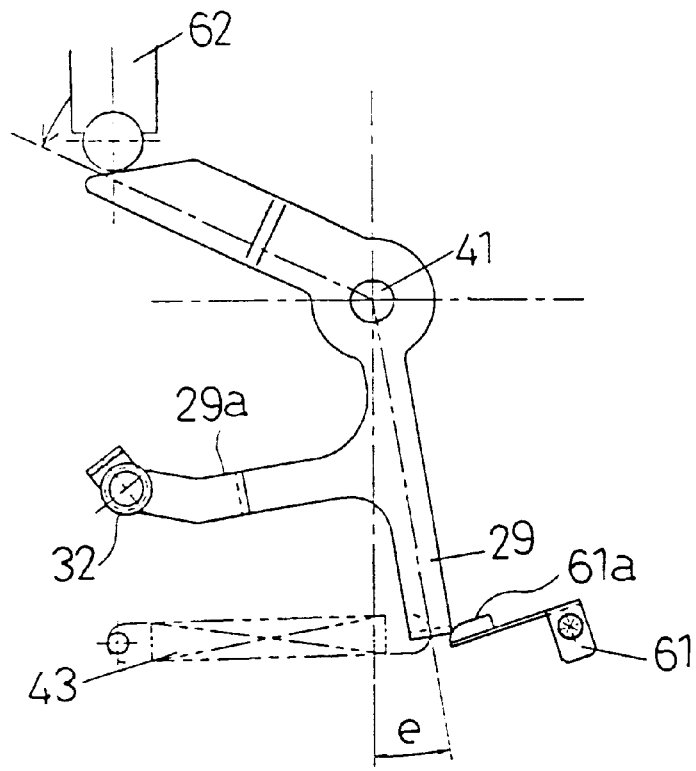
FIGS. 8A and 8B are enlarged views of a stopper of the embodiment.
Figure 8B:
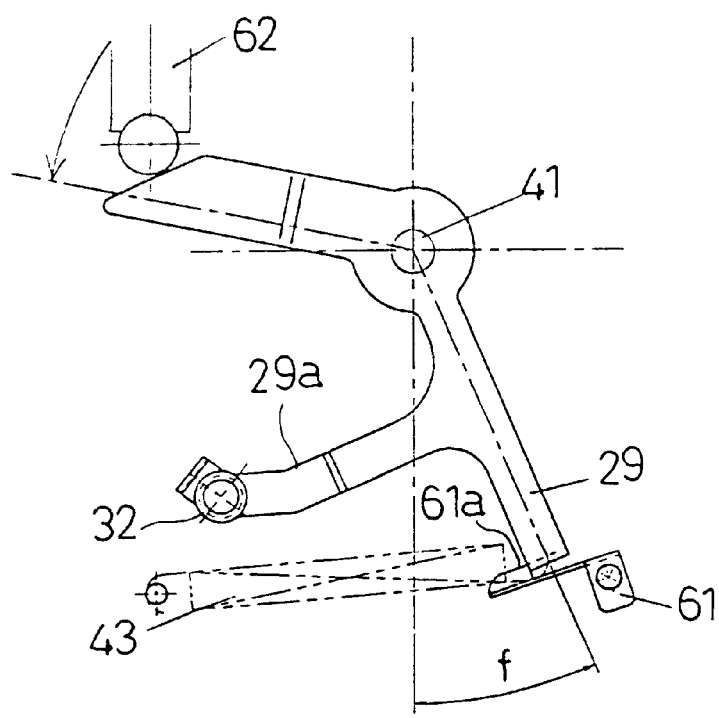

FIGS. 8A and 8B illustrate two cases of actions of the stopper 61 for stopping the feed lever 29 when the feed lever 29 is turned more than required. The stopper 61 comprises a leaf spring and has a finger 61a formed by folding a distal end portion thereof.

In FIG. 8A, the feed lever 29 is turned by hand to feed one of the electronic components 1 from the electronic component carrying tape A loaded manually to the electronic component feeding apparatus. For loading the electronic component carrying tape A to the component feeder, the feed lever 29 is first turned by hand by a stroke e to advance the electronic component carrying tape A to a specific position. Since the feed lever 29 is capable of moving as far as a stroke f, when the feed lever 29 is driven by hand to feed the single electronic component 1, the feed lever 29 rotates about the first pivot center 41 by the stroke e in the counterclockwise direction in FIG. 8A before being hit and stopped by the stopper 61. As the feed lever 29 is returned in the clockwise direction in FIG. 8A by the yielding force of the return spring 43, the electronic component carrying tape A travels a predetermined length to feed only one electronic component 1.

In FIG. 8B, the electronic component feeder is installed in the electronic component mounting apparatus of which actuator lever 62 has been moved excessively by a setting error in the operation program.

Due to the setting error in the program of the electronic component mounting apparatus in which the electronic component feeder is installed, the actuator lever 62 strikes and drives the feed lever 29 to turn about the first pivot center 41 by the stroke f in the counterclockwise direction in FIG. 8B. Then, the actuator lever 62 stops. Meanwhile, when the feed lever 29 has been turned in the counterclockwise direction by the stroke e in FIG. 8B, it hits against the finger 61a of the stopper 61. Since the driving force of the actuator lever 62 for turning the feed lever 29 is greater than the controlling force of the stopper 61 for stopping the feed lever 29, the feed lever 29 is not stopped at this point and moves further by the point of the stroke f. The finger 61a of the stopper 61 then hooks up the feed lever 29 as shown in FIG. 8B. When the actuator lever 62 is driven in the clockwise direction in FIG. 8B, the feed lever 29 attempts to follow the motion of the actuator lever 62 by the yielding force of the return spring 43. However, the feed lever 29 is hooked up by the finger 61a of the stopper 61 and cannot return to its initial position.

Figure 10:
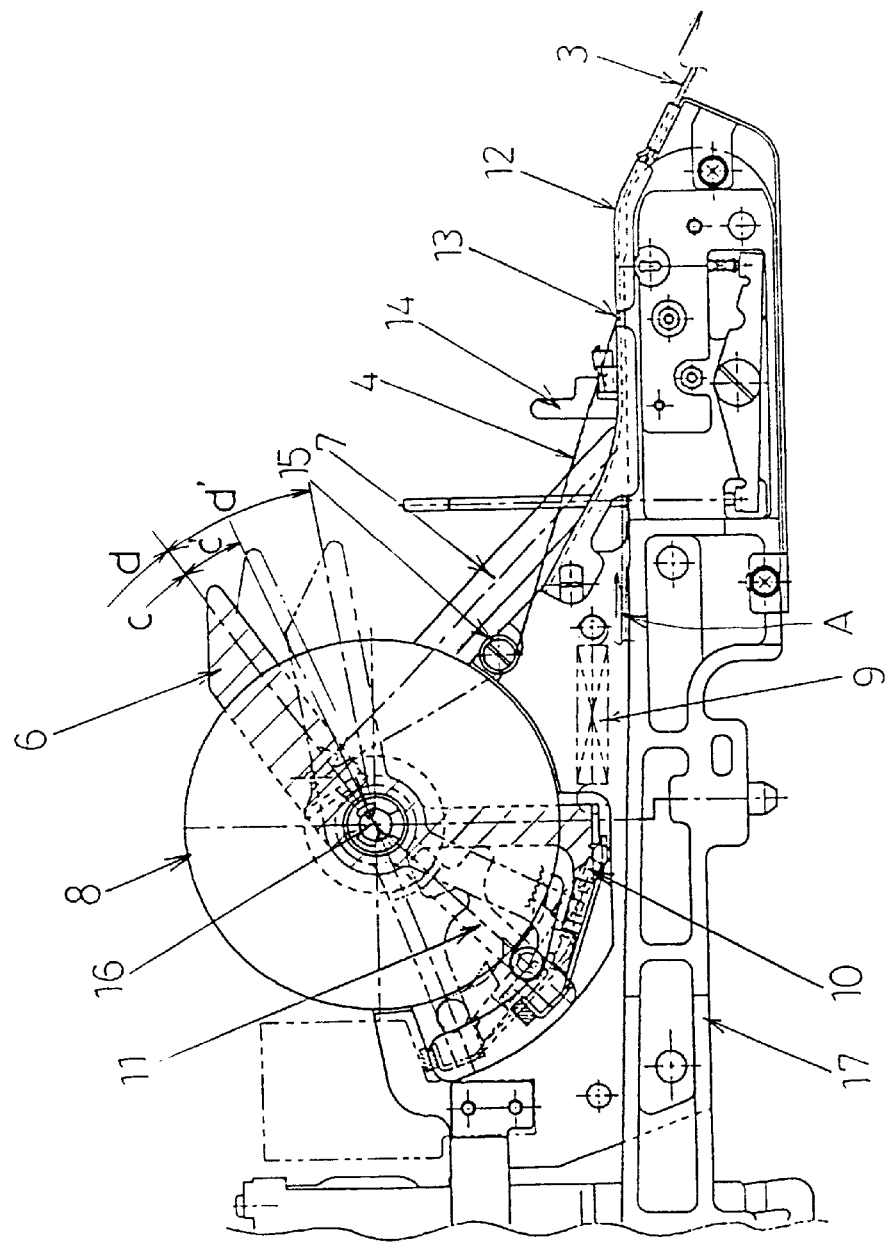
FIG. 10 is a front view of a prior art.
Figure 11:
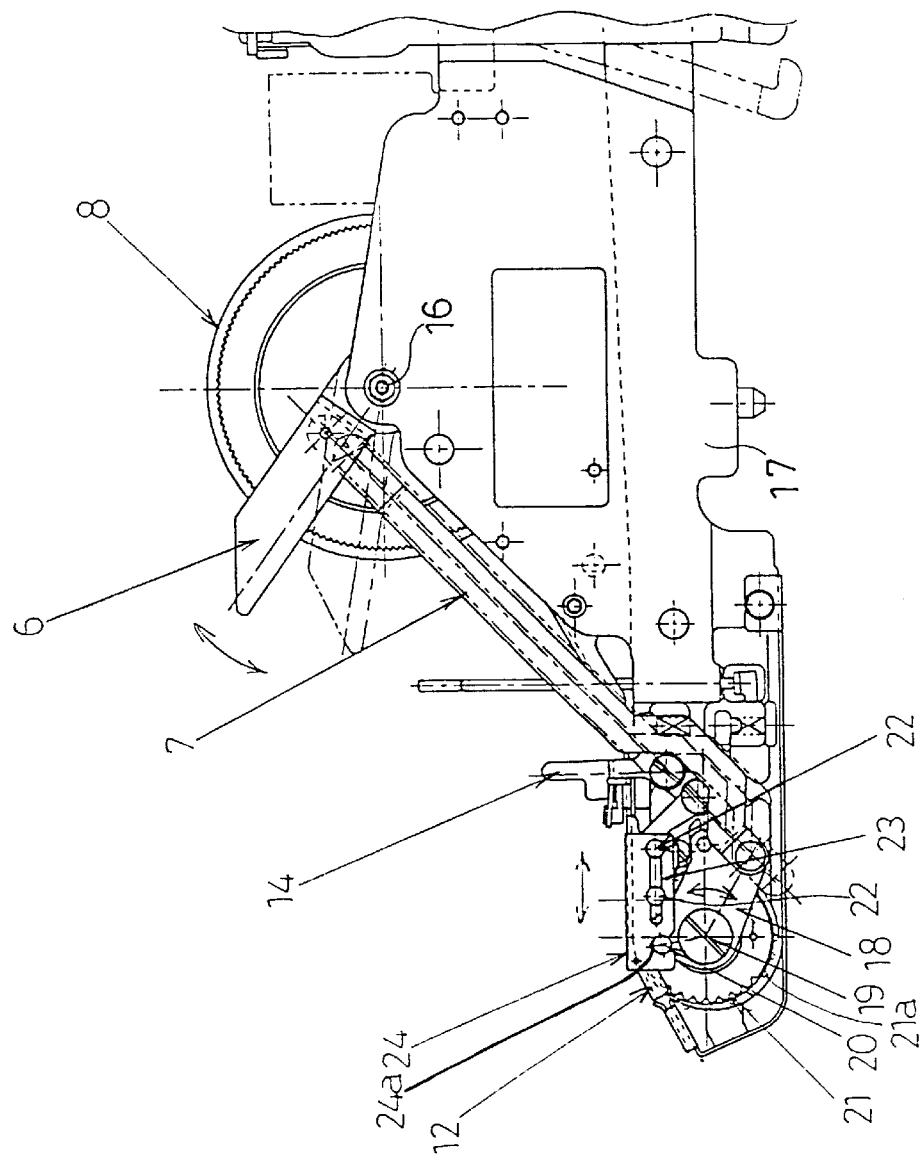
FIG. 11 is a back view of the prior art.
Figure 12A:
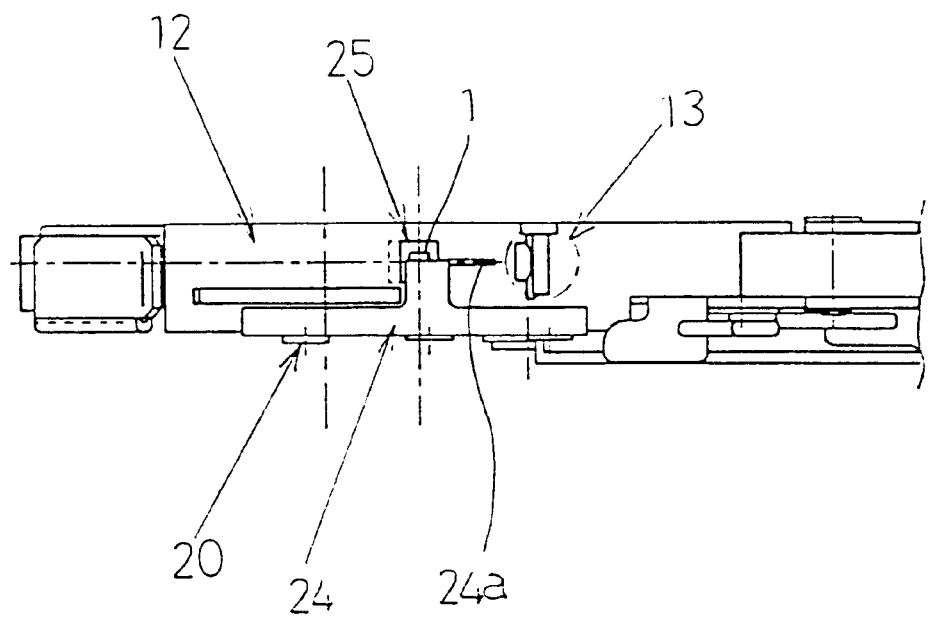
FIGS. 12A and 12B are a plan view and a cross sectional view of a front end section of the prior art respectively.
Figure 12B:
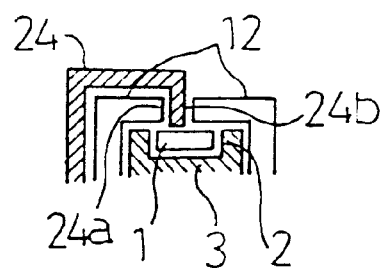
Figure 13:
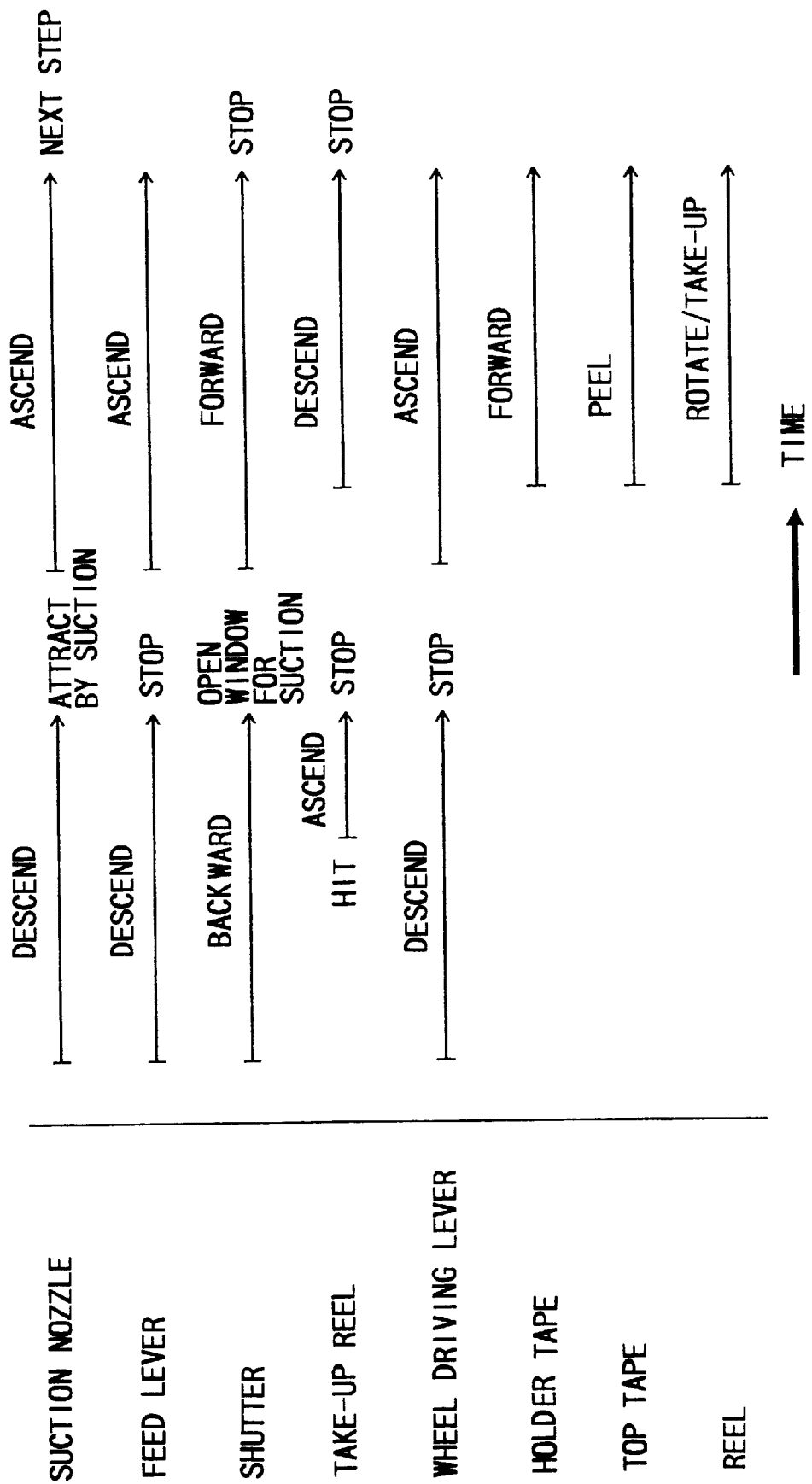
FIG. 13 is a timing chart showing actions of the prior art.
Figure 14:
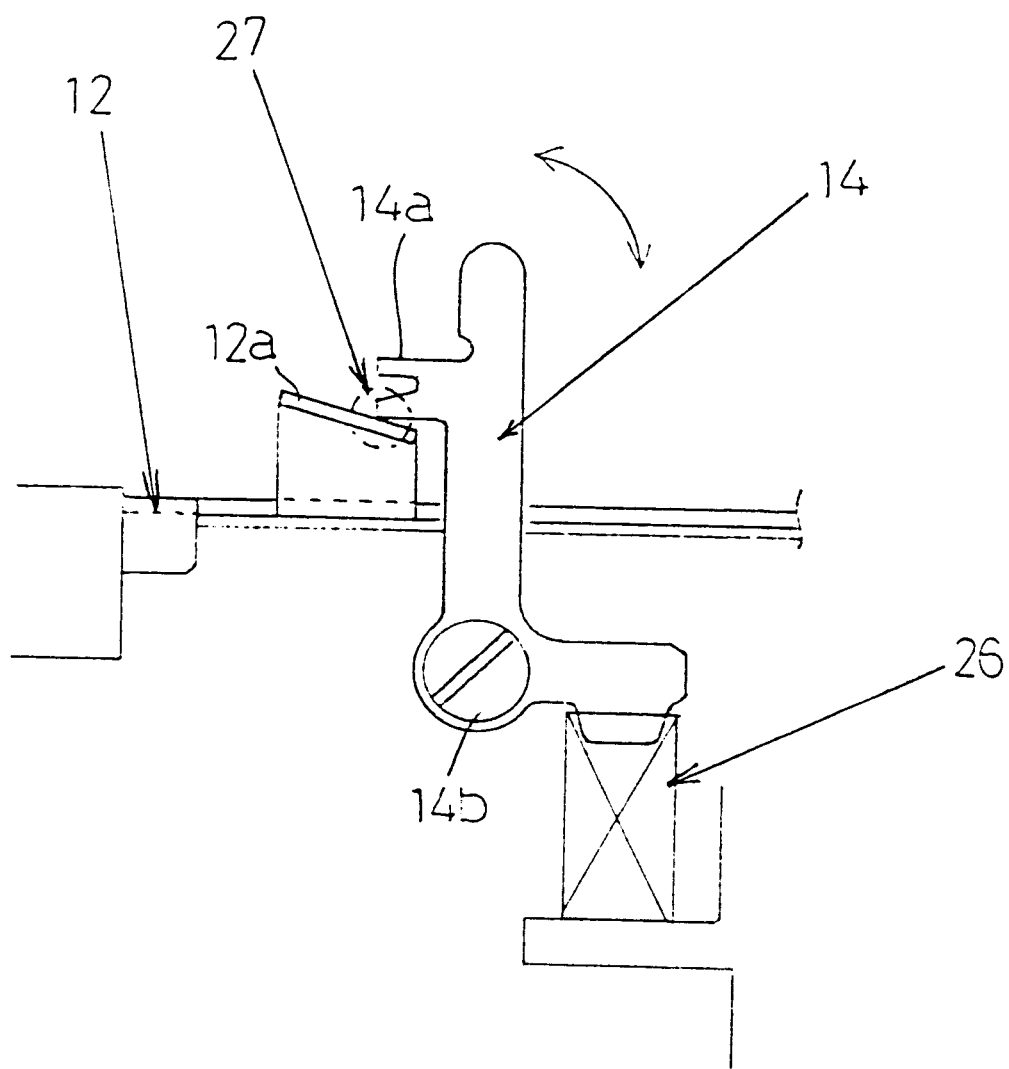
FIG. 14 is an enlarged view of a holding structure of a tape guide of the prior art.
Figure 15A:
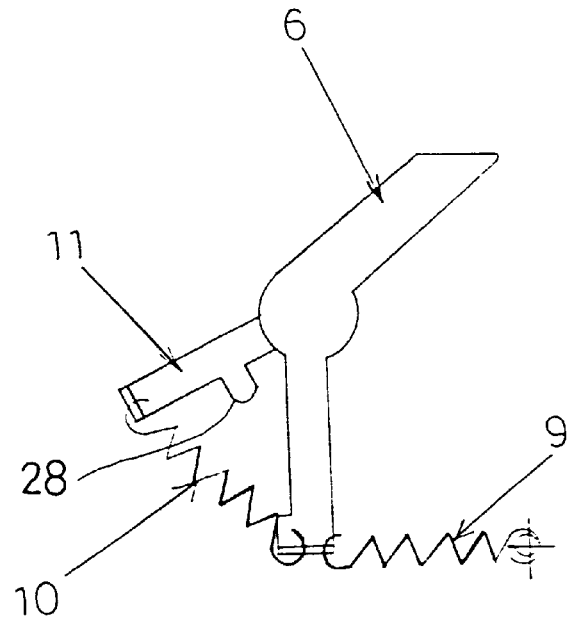
FIGS. 15A and 15B are model views showing the relation between a feed lever and a take-up lever of the prior art.
Figure 15B:
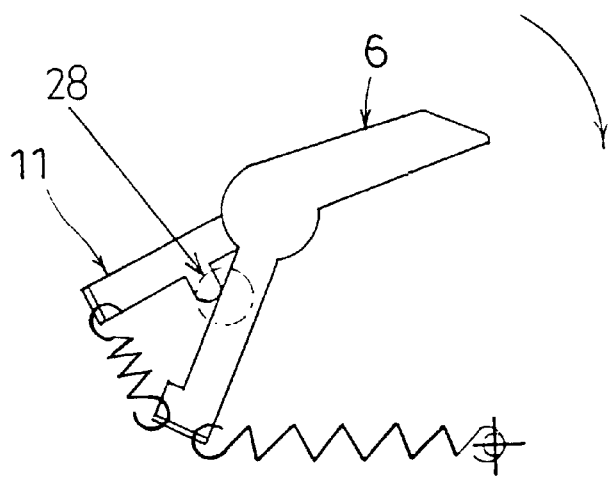

By providing such stopper 61 as described above, the feed lever 29 can be correctly reciprocated by a prescribed stroke for feeding the electronic components 1 one by one from the electronic component carrying tape A manually loaded to the electronic component feeder. Also, the stopper 61 eliminates such a disadvantage that the top tape 4 may be stuck between the tape guide 35 and the feeder body 36. With the electronic component feeder of smaller stroke type installed in the electronic component mounting apparatus, the setting error in the operation program which causes the large stroke motion of the actuator lever 62 is easily identified at an early stage of the operation due to the feed lever 29 caught at the predetermined rotating position f, hence preventing damages to the suction nozzle. Such structure with the stopper 61 is not limited to this embodiment but may be applied to the prior art electronic component feeder shown in FIGS. 10 and 11.

Figure 4:
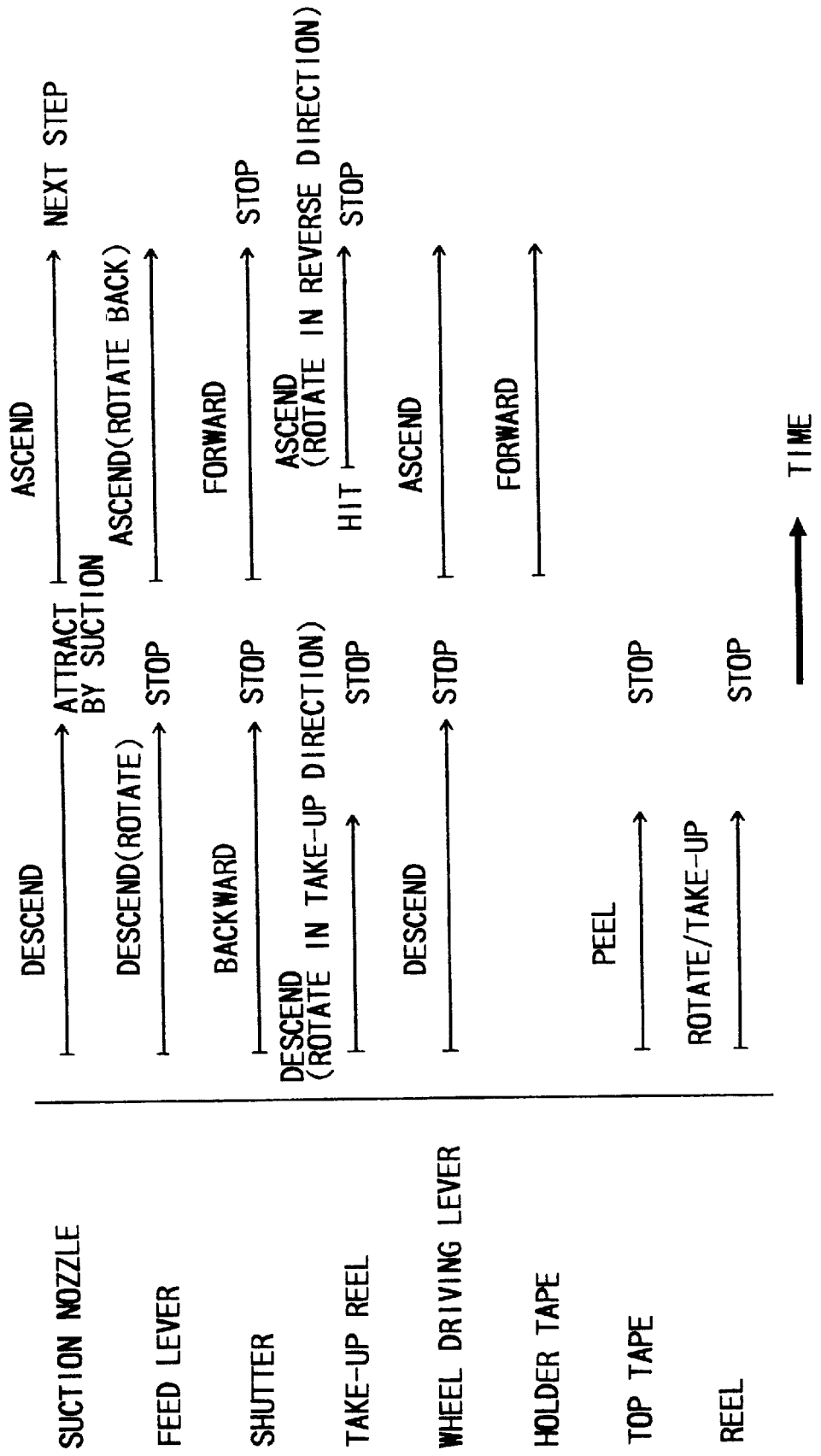
FIG. 4 is a timing chart showing actions of the embodiment.

Various actions in the embodiment corresponding to the motion of the suction nozzle are now explained referring to the timing chart in FIG. 4.

As shown in FIG. 1, the electronic component carrying tape A is supplied in the direction denoted by the arrow from a reel stand (not shown) located on the left-hand side in FIG. 1. The top tape 4 is peeled off through the slit 51 provided in the shutter 34 shown on the right-hand side and as the electronic components 1 have been fed, the holder tape 3 is discharged from the tape guide 35. The top tape 4 peeled off at the slit 51 is conveyed with its length between the stationary roller 31 and the slit 51 kept constant by the action of the movable roller 32, passed through the stationary roller 31, and taken up on the reel 42. The action of the movable roller 32 for keeping the length of the top tape 4 between the stationary roller 31 and the slit 51 constant ensures the smooth movement of the shutter 34, thus allowing the top tape 4 to be peeled off from the holder tape 3 and taken up on the reel 42 in steadiness.

In accordance with the motion of the suction nozzle, the actuator lever 62 of the electronic component mounting apparatus is driven to strike the feed lever 29 which then turns about the first pivot center 41 downwardly in the clockwise direction in FIG. 1 (forward rotation).

The feed lever 29 is joined to the link 37 and the L shaped lever 38. The reciprocating swing motions of the feed lever 29 are hence shifted to the forward and backward rotation about the first pivot center 41 of the take-up lever 40 through the actions of the L shaped lever 38 and the return spring 39.

More particularly, as the feed lever 29 turns in the clockwise direction in FIG. 1 (forward rotation), the link 37 is moved in the clockwise direction in FIG. 1 causing the L shaped lever 38 to turn about the third pivot center 38a in the clockwise direction in FIG. 1.

The feed lever 29, the take-up lever 40, and the reel 42 are all rotatably mounted to the first pivot center 41. The take-up lever 40 is joined by the return spring 39 to the link 37. When the feed lever 29 turns upward in the counterclockwise direction in FIG. 1 (backward rotation), the L shaped lever 38 is turned about the third pivot center 38a in the counterclockwise direction in FIG. 1.

In the relation between the take-up lever 40 and the reel 42 mounted to the first pivot center 41, the reel 42 remains stationary when the take-up lever 40 is turned in the clockwise direction (opposite to the tape take-up direction) in FIG. 1 and when the take-up lever 40 is turned in the counterclockwise (tape take-up) direction, the reel 42 turns in the same direction as that of the take-up lever 40.

Accordingly, when the actuator lever 62 of the electronic component mounting apparatus is driven in accordance with the motion of the suction nozzle to strike and cause the feed lever 29 to turn downward about the first pivot center 41 in the clockwise direction in FIG. 1, the L shaped lever 38 is moved downward in the clockwise direction in FIG. 1.

Although the L shaped lever 38 departs from the take-up lever 40, the restoring force of the return spring 39 joining the take-up lever 40 to the link 37 allows the take-up lever 40 to turn downward in the counterclockwise direction in FIG. 1 without producing any shock or vibration.

While the electronic component carrying tape A is supplied from the left-hand side in FIG. 1 in the direction denoted by the arrow, the counterclockwise downward motion in FIG. 1 of the take-up lever 40 triggers rotation of the reel 42 in the counterclockwise (tape take-up) direction thus permitting the top tape 4 to be peeled off through the slit 51 of the shutter 34 and taken up on the reel 42.

As shown in FIG. 2, the combined actions of the first pin 49 mounted on the wheel driving lever 46 and engaged with the coupling recess 34a of the shutter 34, the second pins 44 mounted on the tape guide 35, and the slot 45 provided in the shutter 34 for guiding the second pins 44 permit the shutter 34 to perform the prescribed linear reciprocating motions over the electronic component carrying tape A in the tape guide 35.

Accordingly, when the feed lever 29 turns downward (forward rotation), the shutter 34 is moved to the right-hand side in FIG. 3, as shown in FIG. 2. Simultaneously, the slit 51 creates a force for peeling the top tape 4 by a length equal to the amount of backward movement of the shutter 34. As a result, the top tape 4 is passed through the movable roller 32 and the stationary roller 31 and taken up on the reel 42.

As shown in FIG. 4, accompanying with the rotation of the take-up lever 40 in the tape take-up direction, the reel 42 rotates to take up the length of the top tape 4 which has been peeled off.

When the actuator lever 62 of the electronic component mounting apparatus is stopped in FIG. 4, the feed lever 29 pauses and the motions of the shutter 34, the link 37, and the L shaped lever 38 are ceased. At this time, the take-up lever 40 and the reel 42 are balanced by the tension of the top tape 4 and thus halted before the L shaped lever 38 stops.

Under this state, the shutter 34 is moved backward to the right-hand side in FIG. 3, allowing its component outlet 34a in recessed form on the left-hand side of the end shutter 34 to locate above the storage recess 2 of the tape A where the electronic component 1 to be picked up is stored. The suction nozzle which has been lifted down picks up the electronic component 1 located at the center of the component outlet 34a and starts to ascend.

In response to the upward movement of the suction nozzle, the actuator lever 62 is turned upward causing the feed lever 29 to follow the upward movement of the actuator lever 62 driven upward by the yielding force of the return spring 43.

This is followed by the upward motion of the link 30 and the wheel driving lever 46, and the shutter 34 moves forward to the left-hand side in FIGS. 2 and 3.

The top tape 4 is advanced without being cut by the action of the movable roller 32 even when peeling is stopped and the shutter is further proceeded.

The wheel driving lever 46 and the wheel 47 are arranged to turn about the second pivot center 48 in the counterclockwise direction in FIG. 2. As the feed lever 29 turns upward, the wheel 47 is turned in the counterclockwise direction in FIG. 2 with the pins 47a at the circumferential edge thereof engaged with the sprocket apertures 5 of the electronic component carrying tape A to advance the electronic component carrying tape A to the left-hand side in FIGS. 2 and 3.

The L shaped lever 38 is then turned upward in the counterclockwise direction in FIG. 1 to hit the take-up lever 40 which has been paused, and push the same to ascend further.

When the electronic component carrying tape A has been advanced by a predetermined distance by the action of the wheel 47, one cycle of actions is finished and the entire apparatus is paused.

INDUSTRIAL APPLICABILITY

As set forth above, the electronic component feeder of the present invention is capable of feeding electronic components in stable postures reliably into an electronic component mounting apparatus and taking up the peeled top tape stably thus increasing the speed of mounting operation.

What is claimed is:

1. An electronic component feeder comprising: a wheel (47) for conveying a holder tape (3) of an electronic component carrying tape (A) by intermittent rotation in one direction and for feeding electronic components (1) stored in their respective storage recesses (2) on the holder tape (3) in sequence to a component pick up position; a reel (42) for taking up a top tape (4) for peeling off the top tape (4) from the holder tape (3) of the electronic component carrying tape (A); a tape guide (35) for receiving and guiding the electronic component carrying tape (A); a shutter (34) which is supported and guided by the tape guide (35) and moves forward and backward in such a way that the shutter (34) covers the electronic components (1) from above stored in the storage recesses (2) of the holder tape (3) after the top tape (4) has been peeled off and clears above the component pick-up position for allowing the electronic component (1) to be picked up only when the shutter (34) is at its retreated position; a slit (51) provided integral with the shutter (34) for passing and directing the top tape (4) peeled off from the holder tape (3) to the reel (42); a feed lever (29) which, on receipt of a driving force from an electronic component mounting apparatus, repeats intermittent reciprocating rotation consisting of forward turning motion, pause, and backward turning motion about a pivot center (41) which is identical with that of the reel (42); a power transmitting means (30, 46) for converting the intermittent reciprocating rotation of the feed lever (29) to intermittent one-directional turning movements of the wheel (47), in such a way that the wheel (47) is turned only when the feed lever (29) turns backward to advance the holder tape (3); a power transmitting means (30, 46, 49) for converting the intermittent reciprocating rotation of the feed lever (29) to intermittent forward and backward movements of the shutter (34), in such a way that the shutter (34) is moved backward when the feed lever (29) turns forward and the shutter (34) is moved forward when the feed lever (29) turns backward; a take-up lever (40) which rotates forward and backward about the pivot center (41) which is identical with that of the reel (42); a spring (39) for giving a bias to cause the take-up lever (40) to rotate in the tape take-up direction; a take-up lever driving member (38) driven by the feed lever (29) for moving detachably to and from the take-up lever (40) so that the take-up lever driving member (38) moves away from the take-up lever (40) when the feed lever (29) turns forward so as to allow the take-up lever (40) to rotate by the urging force of the spring (39) in the tape take-up direction and that when the feed lever (29) turns backward, the take-up lever driving member (38) approaches and contacts the take-up lever (40) and further causes the take-up lever (40) to rotate in a direction opposite to the tape take-up direction; and a one directional power transmitting means for transmitting the rotation in the tape take-up direction of the take-up lever (40) to the reel (42) so as to cause the reel (42) to rotate in the tape take-up direction while not transmitting the rotation in an opposite direction of the take-up lever (40) to the reel (42) so as to allow the take-up lever (40) to rotate freely.

2. An electronic component feeder according to claim 1, further comprising a stationary roller (31) for guiding the top tape (4) peeled off to the reel (42) and a movable roller (32) provided in the middle between the slit (51) and the stationary roller (31) for keeping the length of the top tape (4) between the slit (51) and the stationary roller (31) substantially constant.

3. An electronic component feeder according to claim 2, wherein the movable roller (32) is provided integral with the feed lever (29).

4. An electronic component feeder according to claim 1, 2, or 3, wherein the tape guide (35) is resiliently pressed against a feeder body (36) via a holding member (33), in such a way that the holding member (33) contacts and presses the tape guide (35) through a roller (50).

5. An electronic component feeder according to claim 1, 2, or 3, further comprising a stopper (61) for giving a rotation inhibiting resistance force to the feed lever (29) at a specific position when the feed lever (29) is rotated more than a given amount and for stopping the rotation of the feed lever (29) in its returning rotation at the specific position in the event that the feed lever (29) overcomes the rotation inhibiting resistance and further rotates in the forward direction.

6. An electronic component feeder comprising: a wheel (21, 47) for conveying a holder tape (3) of an electronic component carrying tape (A) by intermittent rotation in one direction and for feeding electronic components (1) stored in their respective storage recesses (2) on the holder tape (3) in sequence to a component pick up position; a reel (8, 42) for taking up a top tape (4) for peeling off the top tape (4) from the holder tape (3) of the electronic component carrying tape (A); a tape guide (12, 35) for receiving and guiding the electronic component carrying tape (A); a shutter (24, 34) which is supported and guided by the tape guide (35) and moves forward and backward in such a way that the shutter (24, 34), clears above the component pick-up position for allowing the electronic component (1) to be picked up only when the shutter (24, 34) is at its retreated position; a slit (13, 51) provided behind the component pick up position for passing and directing the top tape (4) peeled off from the holder tape (3) to the reel (8, 42); a feed lever (6, 29) which, on receipt of a driving force from an electronic component mounting apparatus, repeats intermittent reciprocating rotation consisting of forward turning motion, pause, and backward turning motion about a pivot center (16, 41) which is identical with that of the reel (8, 42); a power transmitting means (7, 18, 30, 46) for converting the intermittent reciprocating rotation of the feed lever (6, 29) to intermittent one-directional turning movements of the wheel (21, 47); a power transmitting means (7, 18, 20, 30, 46, 49) for converting the intermittent reciprocating rotation of the feed lever (6, 29) to intermittent forward and backward move ments of the shutter (24, 34); a power transmitting means (10, 11, 37, 38, 39) for converting the intermittent reciprocating rotation of the feed lever (6, 29) to a tape take-up motion of the reel (8, 42); and a stopper (61) for giving a rotation inhibiting resistance to the feed lever (6, 29) at a specific position when the feed lever (6, 29) rotated more than a given amount and for stopping the rotation of the feed lever (29) in its returning rotation at the specific position in the event that the feed lever (6, 29) overcomes the rotation inhibiting resistance and further rotates in the forward direction.

* * * * *